(12) United States Patent
Suhail et al.

(10) Patent No.: US 7,955,877 B2
(45) Date of Patent: Jun. 7, 2011

(54) METHOD FOR SIMULATING LONG-TERM PERFORMANCE OF A NON-VOLATILE MEMORY BY EXPOSING THE NON-VOLATILE MEMORY TO HEAVY-ION RADIATION

(75) Inventors: Mohammed Suhail, Austin, TX (US); Ko-Min Chang, Austin, TX (US); Peter J. Kuhn, Austin, TX (US); Erwin J. Prinz, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/405,308

(22) Filed: Mar. 17, 2009

(65) Prior Publication Data

US 2010/0240156 A1    Sep. 23, 2010

(51) Int. Cl.
*G01R 31/26* (2006.01)
*H01L 21/66* (2006.01)

(52) U.S. Cl. .................. 438/17; 438/14; 438/15

(58) Field of Classification Search .......... 438/17
See application file for complete search history.

(56) References Cited

U.S. PATENT DOCUMENTS

| | | | |
|---|---|---|---|
| 4,329,421 A | 5/1982 | Wisnosky et al. | |
| 4,572,954 A | 2/1986 | Josephson et al. | |
| 5,488,267 A | 1/1996 | Rudolph et al. | |
| 5,502,354 A | 3/1996 | Correa et al. | |
| 6,064,555 A | 5/2000 | Czajkowski et al. | |
| 6,586,751 B1 | 7/2003 | Pichon et al. | |
| 6,717,430 B2 | 4/2004 | Burch | |
| 2003/0153105 A1 | 8/2003 | Burch | |
| 2005/0113869 A1 | 5/2005 | Price | |
| 2005/0208684 A1* | 9/2005 | Yamada et al. ........... | 438/14 |

OTHER PUBLICATIONS

Cellere et al. in "Single Event Upset in FG Memory Arrays", published in 2007, IEEE: Non-Volatile Memory Technoloy Symposium 2007, NVMTS '07, p. 25-29.*
Larcer et al. in "Data Retention After Heavy Ion Exposure of Floating Gate Memories: Analysis and Simulation", published in 2003, IEEE Transactions on Nuclear Science, vol. 50, Nov. 6, p. 2176-2183.*

(Continued)

*Primary Examiner* — N Drew Richards
*Assistant Examiner* — Michael Jung
(74) *Attorney, Agent, or Firm* — James L. Clingan, Jr.; David G. Dolezal

(57) ABSTRACT

Testing a non volatile memory by exposing the non volatile memory to particle radiation (e.g. xenon ions) to emulate memory cell damage due to data state changing events of a non volatile memory cell. After the exposing, the memory cells are subjected to tests and the results of the tests are used to develop reliability indications of the non volatile memory. Integrated circuits with non volatile memories of the same design are provided. Reliability representations of the integrated circuits can be made with respect to a number of data state charging events based on the exposure and subsequent tests.

17 Claims, 3 Drawing Sheets

OTHER PUBLICATIONS

Oldham et al. in "Heavy Ion Testing of Freescale NanoCrystal Non-volatile Memory", presented and published in 2004, IEEE: Non-Volatile Memory Technology Symposium, NVMTS '04, p. 1-18.*

Cester et al, "Ionising radiation and electrical stress on nanocrystal memory cell array," (Feb. 22, 2007) Microelectronics Reliabilty 47, pp. 602-605.* Wrachen et al., "Investigation of Proton and X-Ray Irradiation Effects on Nanocrystal and Floating Gate Memory Cell Arrays," (Dec. 31, 2008), IEEE Transactions on Nuclear Science, vol. 55, No. 6, pp. 3000-3008.*

Gerardin et al., "Impact of Heavy-Ion Strikes on Minimum-Size MOSFETs With Ultra-Thin Gate Oxide," (Dec. 2006), IEEE Transactions on Nuclear Science, vol. 53, No. 6, pp. 3675-3680.*

Schwartz et al; "Single-Event Upset in Flash Memories"; IEEE Transactions on Nuclear Science, vol. 44, No. 6, Dec. 1997.

Oldham et al; "Effects of Heavy Ion Exposure on Nanocrystal Nonvoltaile Memory"; IEEE Transactions on Nuclear Science, vol. 52, No. 6, Dec. 2005.

* cited by examiner

METHOD FOR SIMULATING LONG-TERM PERFORMANCE OF A NON-VOLATILE MEMORY BY EXPOSING THE NON-VOLATILE MEMORY TO HEAVY-ION RADIATION

BACKGROUND

1. Field

This disclosure relates generally to integrated circuits, and more specifically, to making non-volatile memories.

2. Related Art

Non-volatile memories (NVMs) have a number of reliability issues such as data retention, operational life, program disturb, and read disturb. To a large extent, reliability is related to the number of program/erase cycles that have been performed on the NVM. For some uses only a few thousand cycles may be sufficient, but many uses require hundreds of thousands of program/erase cycles and some even into the millions. A single program/erase cycle of an entire NVM can easily take nearly 10 seconds because of the relatively slow program and erase operations and the large number of cells that are present in typical NVMs. For example, greater than 8 megabits is not uncommon. Accordingly, it can take weeks just to perform the requisite number of program/erase cycles for one of the reliability tests. This can significantly slow down development of new NVM designs as well as product qualifications. There is considerable effort in testing new designs of device structures that have primary significance in the reliability of an NVM. For example, the design of the gate dielectric between a floating gate and a substrate of an NVM is very significant to reliability especially those aspects of reliability related to the number of program/erase cycles.

Accordingly there is a need to determine reliability without having to perform large quantities of program/erase cycles.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

A non-volatile memory (NVM) is able to be tested for some reliability requirements by applying particle radiation at a high energy that causes similar results to that caused by running a relatively large number of program/erase cycles. Thus, the NVM can be tested for these particular reliability requirements without having to wait for the performance of the large number of program/erase cycles. After testing, the test results are used to determine a reliability indication as if program/erase cycles had been performed. Ultimately, using the particle radiation and subsequent testing, a particular design is considered ready for manufacturing which is then done. Further the NVM may then be specified with regard to the reliability test. This is better understood by reference to the drawings and the following description.

Figure 1:
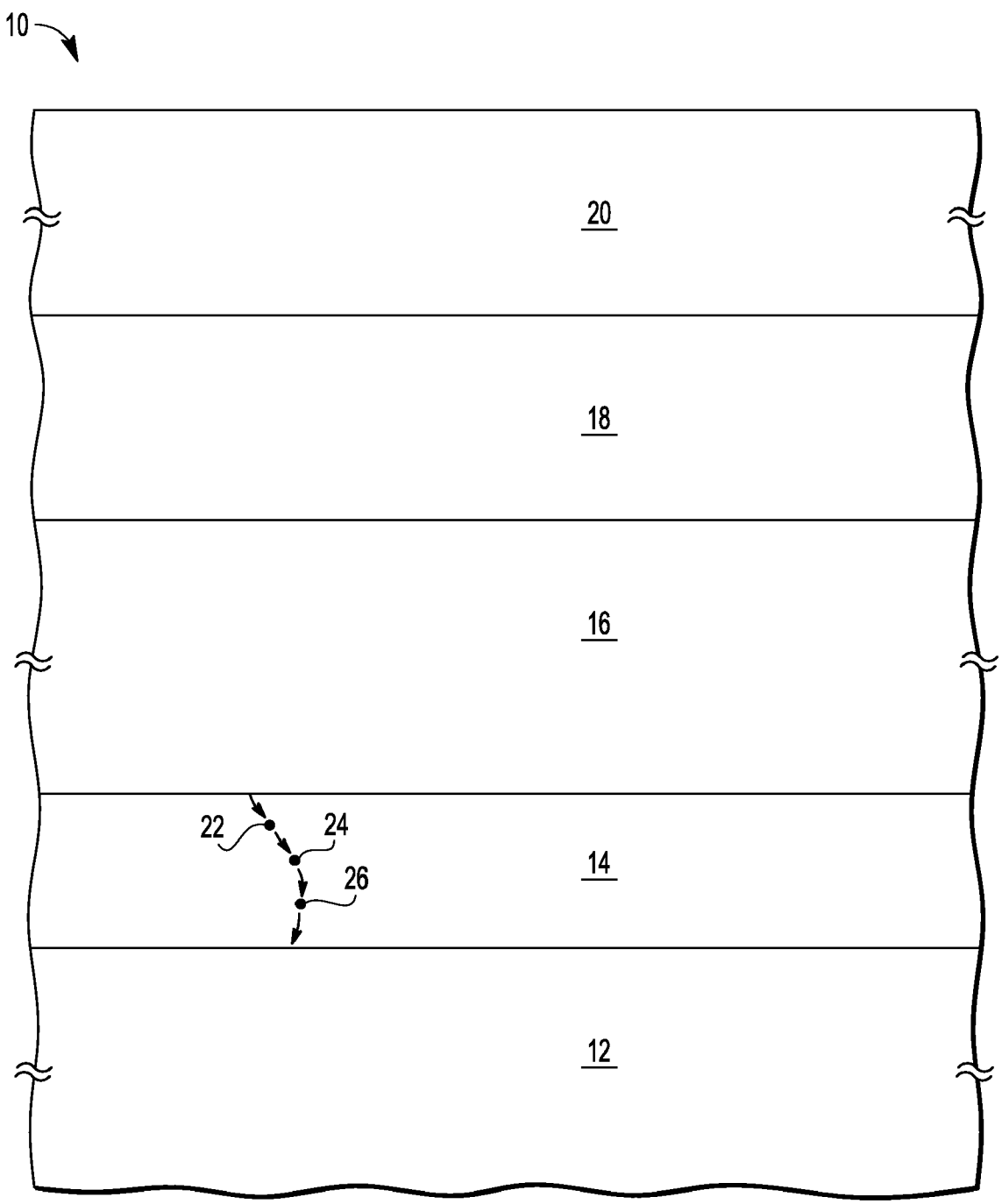
FIG. 1 is a cross section of a portion of an NVM cell on which is applied a portion of an embodiment of the method.

Shown in FIG. 1 is a portion of an NVM cell 10 comprising a substrate 12, a tunnel dielectric 14 over substrate 12, a floating gate 16 over tunnel dielectric 14, a dielectric layer 18 over floating gate 16, and a control gate 20 over dielectric layer 18. Substrate 12 may be silicon. Tunnel dielectric may be an oxide layer that is thermally grown to about 90 Angstroms. Floating gate 16 may be polysilicon about 1000 Angstroms. Dielectric layer 18 may be a stack of oxide, nitride, and oxide commonly known as ONO and may be about 200 Angstroms thickness. Control gate 20 may be polysilicon of about 1000 Angstroms in thickness. One of the reliability tests generally applied to NVMs such as NVM 10 is data retention after a number of program/erase cycles. Defects such as 22, 24, and 26 occur with program/erase cycles. When the defects occur as shown in FIG. 1 for defects 22, 24, and 26, the defects provide a path between substrate 12 and floating gate 16 for electrons to move. This causes a reduction in data retention time. In order to properly specify what the data retention time of the NVM that has memory designed the same as memory 10, it is necessary to know the relationship between program/erase cycles and data retention. In practice every program cycle is preceded by an erase cycle so in effect. Similarly, an erase cycle is generally assumed to have been preceded by a program cycle otherwise there is no real need for the erase cycle. Thus a specification can be written for a number of program cycles, a number of erase cycles, or a number of program/erase cycles and would typically have the same resulting meaning. Also performing a program, an erase, or a program/erase can each be considered a data changing event.

Figure 2:
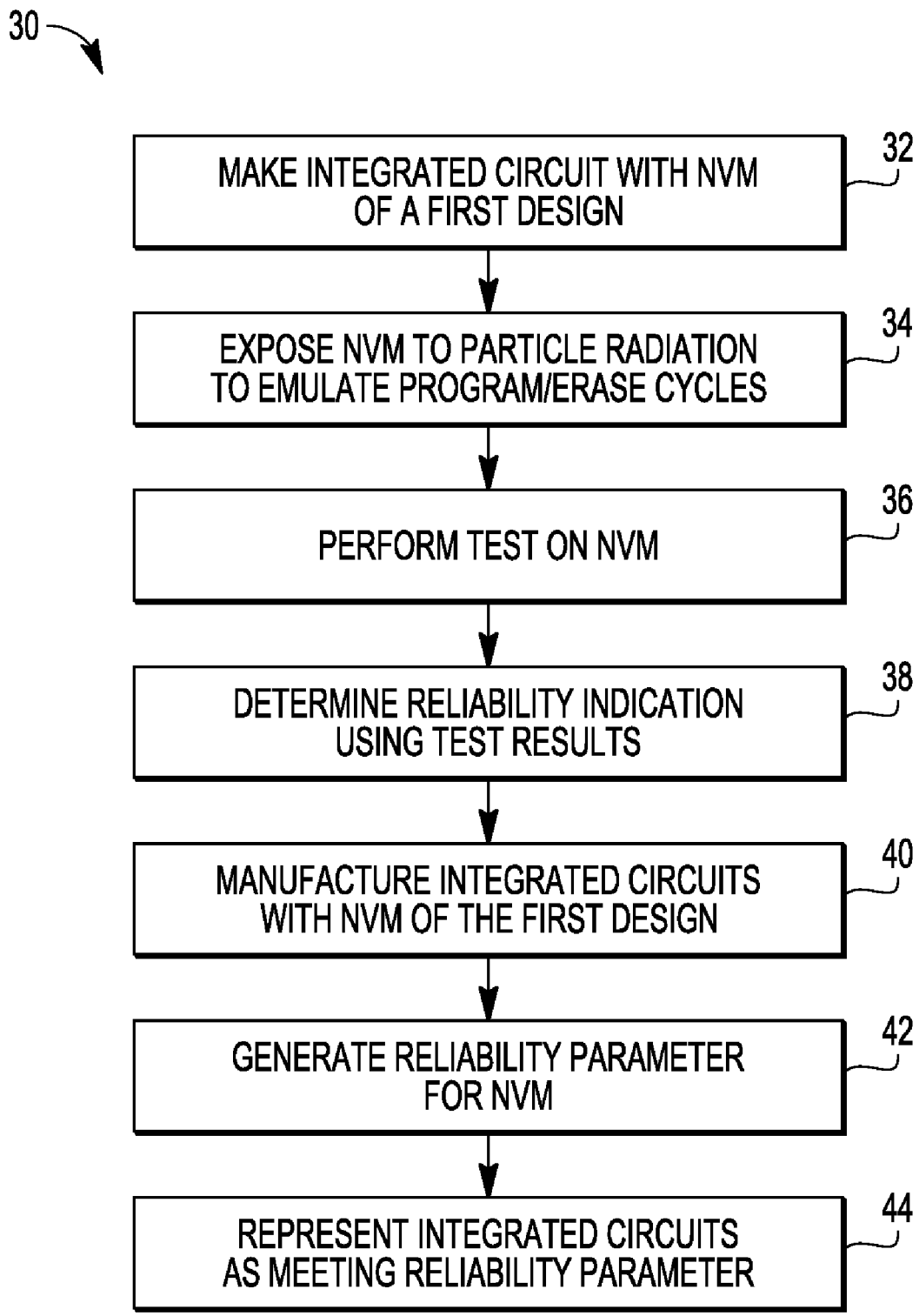
FIG. 2 is a flow diagram of a method of the embodiment.

Shown in FIG. 2 is a method 30 for manufacturing integrated circuits having an NVM of a first design such as that shown in FIG. 1. At a step 32, an integrated circuit is made with the first design. At a step 34, the NVM is exposed to particle radiation to emulate program/erase cycles. At a step 36, a test is performed on the NVM. At step 38 reliability indication is determined using test results from step 36. At a step 40, integrated circuits with an NVM of the first design are manufactured. At a step 42, a reliability parameter is generated from the NVM based on the test results. At a step 44, representations are made that the integrated circuits meet the reliability parameter.

A number of issues go into making a design and the tunnel dielectric is one major component. The particle radiation may be achieved using a cyclotron. Although cyclotrons are not likely to be part of a semiconductor manufacturing facility any time soon due to their sized and expense, many cyclotrons are available to be rented for reasonable fees for short times which is all that is needed. An example of an exposure of particle radiation is xenon ions at 1299 mega electron volts per ion for a time to achieve 1E7 ions per centimeter squared. The range is 102 microns through silicon. The cyclotron is tuned to 15 mega electron volts per nucleon. By the range being 102 microns, there is no risk of xenon ions being left in the NVM. Step 34 is believed to result in defects, such as defects 22, 24, and 26, that are of the same type as that caused by program/erase cycles. Thus, the exposure of NVM 10 to particle radiation can have the same affect as a number of program/erase cycles. Thus for a given reliability test that is related to program/erase cycles, exposure to particle radiation can be used instead of actually performing the program/erase cycles.

One example of a reliability test that uses program/erase cycles is data retention which is specified as a time for retaining data after a given number of program/erase cycles. For example, a specification may state that an NVM can retain data for 5 years after 100,000 program/erase cycles. Of course actually testing for 5 years is not feasible, but existing techniques are available for accelerating the time for determining if data can be retained for 5 years. For such a data retention specification, much time is saved by applying particle radiation to the NVM for emulating the effect of program/erase cycles. Another reliability specification is life of the NVM. Life testing is similar to testing for data retention but in a life test, the NVM is continuously powered and read often. In data retention testing, the NVM is not powered during the test period. Other reliability tests related to the number of program/erase cycles include program disturb and read disturb. Program disturb occurs when a cell that is not being addressed is programmed during the programming of other memory cells. This can get worse with program/erase cycles. In one read disturb situation, performing a read can cause a cell to lose its logic state and the propensity for this to happen increases with program/erase cycles. In another read disturb situation, cells which are not being addressed are disturbed while other memory cells are read. Thus, after an exposure to particle radiation, one or more reliability tests based on program/erase cycles can be performed without having to wait for the performance of the program/erase cycles.

The results of these test or tests are then used to evaluate the design. Also this can be done as a comparison to an alternative design. Thus, the reliability indication may be simply that one design is better than the other. Also this can cause the rejection of both designs. At some point there will be a design that is acceptable and manufacturing of the integrated circuit with the NVM of the design proceeds. Along with manufacturing, the particular reliability specifications are generated based in part on the results of tests on integrated circuits that had been exposed to particle radiation. Further, representations to customers are made relative to the reliability specifications.

Figure 3:
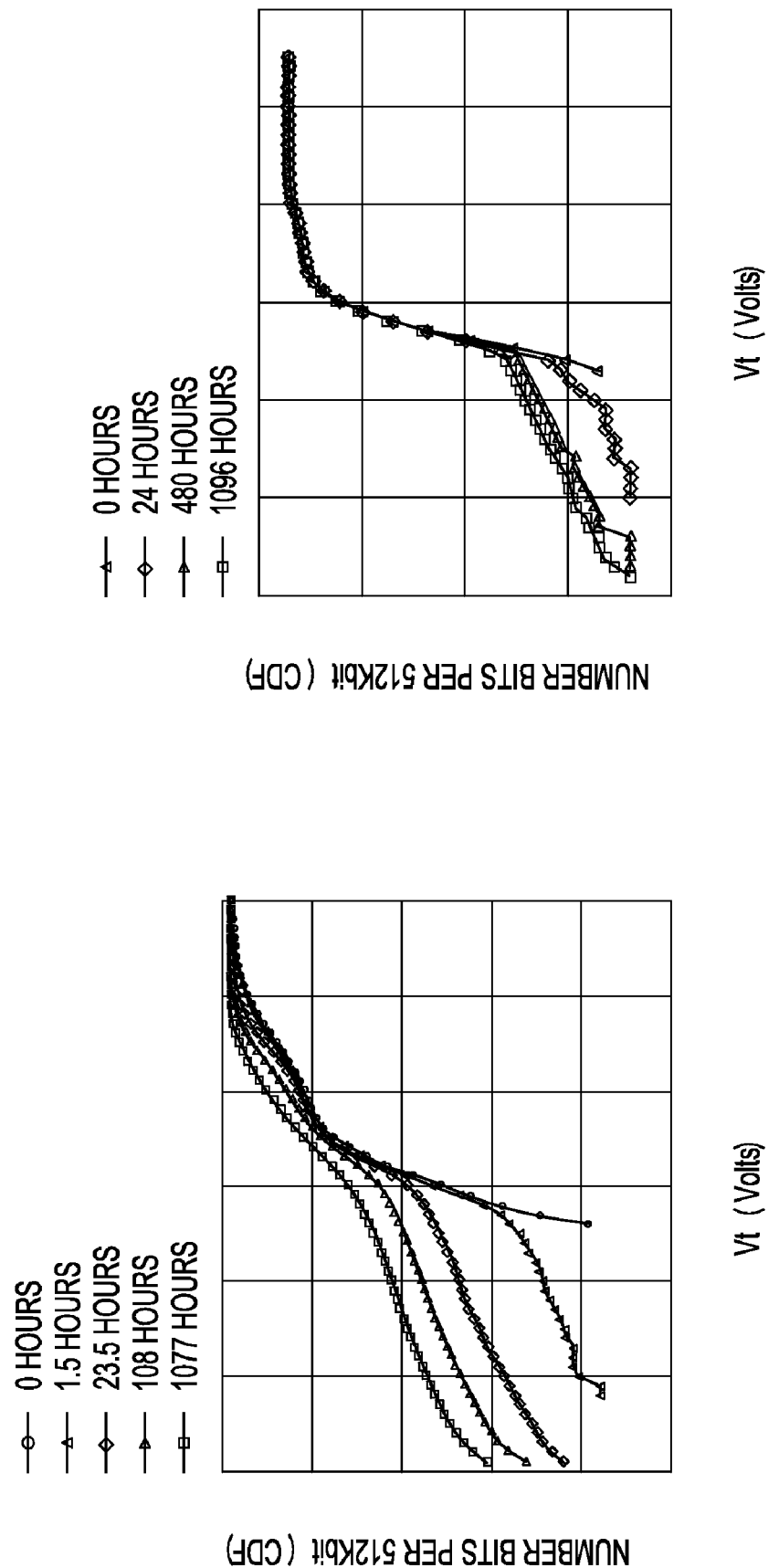
FIG. 3 has graphs showing effects of particle exposure and program/erase cycles on an NVM cell.

The effect of the particle bombardment and program/erase cycles on 2 different NVM types is shown in FIG. 3. Both graphs show threshold voltage, which is what is changed by program/erase cycles, at different times after programming. The graph on the left is for an NVM that has undergone 10,000 program/erase cycles. The graph on the right is for an NVM that has undergone exposure to the particle radiation described previously. One curve is for the threshold voltage at the time of programming and the other three are for increased times after programming. This shows that the lower part of the curve moves to the left with time. This is sometimes referenced as the tail which is distinctive to the effect of program/erase cycles and thus confirms the correlation between the effect of particle radiation and program/erase cycles.

To substitute particle radiation for program/erase cycles, it is important to know what particular particle radiation parameters are representative of how many cycles. In the example in FIG. 3, the NVM type of the graph on the left has a known relationship to the type of NVM in the right graph. Thus, the curve on the left can be converted, through modeling, to what the curve would look like for the type of NVM on the left. Further, then the difference between the newly generated curves and the curves on the right can be compared through modeling to obtain the equivalent number of program/erase cycles on the right. It may not be necessary to fine tune the parameters of the particle radiation to obtain a specific equivalent number of program/erase cycles, such as 100,000, because, through modeling, the tests can be adjusted to obtain accurate predictions as to what would be the data retention, for example, at 100,000 program/erase cycles.

One type of modeling useful in this regard is a conduction model using a reliability assessment methodology to evaluate Data Retention in floating gate non-volatile memories. The conduction model may be general in form without direct knowledge of the underlying physics behind the leakage mechanism. A model of this type retains the flexibility to model several known, or as yet unknown leakage mechanisms or combinations thereof. The estimation of model parameters and the reliability assessment methodology is based on the behavior of an ensemble of affected bits. Such models can be combined with accelerated E-field stress to gather data within a reasonable period of time that may then be used to predict long-term reliability. Statistical methods to correlate the P/E cycling dependence of the charge leakage of flash memory arrays have been established in these type of models Although the invention is described herein with reference to specific embodiments, various modifications and changes can be made without departing from the scope of the present invention as set forth in the claims below. For example, the circuit has been described as a non-volatile memory which may be a stand alone device or on-board an integrated circuit that has other functionality such as processing capability so that the integrated circuit is considered a microcomputer. Also providing the non-volatile memory may include making the integrated circuit, having it made, or obtaining it in some other manner. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of developing a design of a non volatile memory comprising:
   exposing a non volatile memory made according to a first design to particle radiation of a species having an atomic mass of 50 or greater for sufficient time and of sufficient energy to emulate memory cell dielectric damage due to read/write cycles of a plurality of the non volatile memory cells of the non volatile memory and for the species to pass through the non volatile memory to emulate memory cell dielectric damage due to program/erase cycles of a plurality of non volatile memory cells of the non volatile memory;
   performing tests on the non volatile memory made according to the first design after the exposing to generate results of the tests; and
   determining a reliability specification of the non volatile memory made according to the first design using the results of the tests, wherein the reliability specification is based on at least 100,000 program/erase cycles.

2. The method of claim 1 further comprising:
changing the design from the first design to a second design;
exposing a non volatile memory made according to the second design to particle radiation to emulate memory cell dielectric damage due to program/erase cycles of a plurality of non volatile memory cells of the non volatile memory made according to the second design;
performing tests on the non volatile memory made according to the second design after the exposing to generate results of the tests; and
determining the reliability specification of the non volatile memory made according to the second design using the results of the tests.

3. The method of claim 2 wherein the performing tests on the non volatile memory made according to the second design includes storing a charge in each of the plurality of non volatile memory cells and measuring a voltage threshold of each of the plurality of non-volatile memory cells after the charge is stored.

4. The method of claim 3 wherein performing tests on the non volatile memory made according to the second design includes measuring the voltage threshold for a second time of each of the plurality of memory cells after the measuring.

5. The method of claim 1 wherein the performing tests includes performing operational life tests on the non volatile memory.

6. The method of claim 1 wherein the exposing the non volatile memory includes exposing the non volatile memory to xenon ion particle radiation.

7. The method of claim 6 further comprising:
generating the reliability specification for the non volatile memory based on the determining, wherein the reliability specification is given with respect to a number of data state changing events, wherein the number corresponds to characteristics of the exposing, wherein the characteristics of the exposing include a species dosage of the xenon particle radiation.

8. The method of claim 7 further comprising:
providing a plurality of integrated circuits with a non volatile memory based on the first design;
representing the plurality of integrated circuits with a non volatile memory as meeting the reliability specification.

9. The method of claim 1 wherein the performing tests include performing program disturb tests on the non volatile memory.

10. The method of claim 1 wherein the performing tests include performing read disturb tests on the non volatile memory.

11. The method of claim 1 wherein the performing tests include performing sector disturb tests on the non volatile memory.

12. The method of claim 1 wherein the exposing includes exposing to emulate tunnel dielectric damage due to data state changing events of the plurality of non volatile memory cells.

13. The method of claim 12 wherein each of the plurality of non volatile memory cells is characterized as a 1 T floating gate memory cell that includes a floating gate and a tunnel dielectric between the floating gate and a substrate.

14. A method of developing non volatile memory, the method comprising:
exposing a non volatile memory to particle radiation of a species having an atomic mass of 50 or greater for sufficient time and of sufficient energy to emulate memory cell dielectric damage due to read/write cycles of a plurality of the non volatile memory cells of the non volatile memory and for the species to pass through the non volatile memory, wherein the non volatile memory including a plurality of non volatile memory cells and each non volatile memory cell of the plurality of non volatile memory cells includes a charge storage structure;
measuring a voltage threshold of each of the plurality of non volatile memory cells after the exposing; and
determining a reliability specification of the non volatile memory using results of the measuring, wherein the reliability specification is based on a number of read/write cycles of at least 100,000, wherein the number corresponds to characteristics of the exposing, wherein the characteristics of the exposing include species dosage of a particle radiation.

15. The method of claim 14 further wherein the non volatile memory is of a first design, the method further comprising:
providing a plurality of integrated circuits with a non volatile memory based on the first design;
representing the plurality of integrated circuits with a non volatile memory as meeting the reliability specification.

16. The method of claim 14 wherein the exposing the non volatile memory includes exposing the non volatile memory to xenon ion particle radiation.

17. A method of developing non volatile memory, the method comprising:
exposing a non volatile memory to particle radiation of a species having an atomic mass of 50 or greater for sufficient time and of sufficient energy to emulate memory cell dielectric damage due to read/write cycles of a plurality of the non volatile memory cells of the non volatile memory and for the species to pass through the non volatile memory, the non volatile memory being of a first design, each volatile memory cell of the plurality of non volatile memory cells including charge storage structure and a dielectric;
storing a charge in each of the plurality of memory cells after the exposing;
measuring a voltage threshold of each of the plurality of non volatile memory cells after the storing;
determining a reliability specification of the non volatile memory using results of the measuring, wherein the reliability specification is given as at least five years with respect to a number of read/write cycles, wherein the number corresponds to characteristics of the exposing, wherein the characteristics of the exposing include species dosage;
providing a plurality of integrated circuits with a non volatile memory based on the first design; and
representing the plurality of integrated circuits with a non volatile memory as meeting the reliability specification.

* * * * *